United States Patent [19]

Yamazaki et al.

[11] Patent Number: 4,936,251
[45] Date of Patent: Jun. 26, 1990

[54] VAPOR-PHASE REACTION APPARATUS

[75] Inventors: Shunpei Yamazaki; Mamoru Tashiro; Minoru Miyazaki; Mitsunori Sakama; Takeshi Fukada, all of Tokyo, Japan

[73] Assignee: Semiconductor Energy Laboratory Co., Ltd., Kanagawa, Japan

[21] Appl. No.: 725,596

[22] Filed: Apr. 22, 1985

[30] Foreign Application Priority Data

Apr. 20, 1984 [JP] Japan ................................ 59-079624
Apr. 8, 1985 [JP] Japan ................................ 60-075051

[51] Int. Cl.$^5$ ...................... C23C 16/50; C23C 16/54
[52] U.S. Cl. .................................... 118/719; 118/723; 118/728; 422/49; 422/186; 427/248.1
[58] Field of Search .................... 422/46, 49, 186, 241; 427/248.1; 118/723, 719, 728

[56] References Cited

U.S. PATENT DOCUMENTS

| 1,387,080 | 8/1921 | Smith | 422/241 |
| 1,426,920 | 8/1922 | Sleeper | 422/241 |
| 2,970,042 | 1/1961 | Lagerway | 422/49 |
| 4,235,841 | 11/1980 | Zimmerman | 422/241 |
| 4,315,479 | 2/1982 | Toole et al. | 118/719 |
| 4,576,830 | 3/1986 | Kiss | 118/719 X |
| 4,666,734 | 5/1987 | Kamiya et al. | 118/719 |

Primary Examiner—Michael S. Marcus
Assistant Examiner—Jill Johnston
Attorney, Agent, or Firm—Gerald J. Ferguson, Jr.

[57] ABSTRACT

A vapor phase reaction apparatus includes a reaction chamber defined by first and second walls fixed opposite each other. Third and fourth walls are introduced into the reaction chamber already having affixed to them a substrate for deposition. A reactive gas is introduced into the reaction chamber for chemical vapor deposition onto the substrate.

9 Claims, 2 Drawing Sheets

VAPOR-PHASE REACTION APPARATUS

BACKGROUND OF THE INVENTION

1. Field of the Invention

The present invention relates to a vapor-phase reaction apparatus which excites a reactive gas to cause the deposition of the resulting reaction product on a substrate or on each substrate.

2. Description of the Prior Art

Heretofore a variety of vapor-phase reaction apparatus have been proposed. According to the prior art, a reaction product of a reactive gas is deposited on a substrate in a reaction chamber. In this case, the inner wall of the reaction chamber is also deposited with the reaction product. Therefore, when another reaction product is deposited on another substrate using another reaction gas in the same reaction chamber, there is a fear that the reaction product will mix with the previous reaction product.

SUMMARY OF THE INVENTION

It is therefore an object of the present invention to provide a novel vapor-phase reaction apparatus which is free from the abovesaid defect of the prior art.

The vapor-phase reaction apparatus of the present invention is provided with a reaction chamber, in which a reaction region defined. The reaction region is defined by first and second opposite walls disposed in the reaction chamber, third and fourth opposite walls which are introduced into the reaction chamber from the outside thereof, together with a substrate, and fifth and sixth walls which are disposed in the reaction chamber or introduced thereinto from the outside thereof, along with the third and fourth walls. The vapor-phase reaction apparatus includes means for introducing a reactive gas into the reaction region from the outside of the reaction chamber at the side of the first wall, means for exhausting gas in the reaction region to the outside of the reaction chamber from the side of the second wall, means for exciting the reactive gas introduced into the reaction region, and means for supporting the substrate in the reaction region so that the major surface of the substrate may lie in parallel to a stream of the reactive gas.

With such an apparatus of the present invention, the reactive gas is substantially excited in the reaction region defined in the reaction chamber and the reaction product is deposited on the substrate. Therefore, even if the reaction product is deposited on the inner surfaces of the walls defining the reaction region, substantially no reaction product is deposited on the inner wall of the reaction chamber. When the same reaction chamber is used for depositing a different reaction product on a different substrate using a different reactive gas, the substrate is placed in the reaction region, together with new third and fourth opposite walls, or new third to sixth opposite walls for defining the reaction region. Accordingly, substantially no previous reaction product is mixed in the subsequent reaction product, and if any, its amount is negligibly small.

In accordance with an aspect of the present invention, since a stream of the reactive gas is passed over the major surface of the substrate in the reaction region, the reaction product is homogeneously deposited on the entire area of the substrate surface.

In accordance with another aspect of the present invention, since exciting electric lines of force and/or exciting rays are coextensive with the major surface of the substrate in the reaction region, the reaction product is homogeneously deposited all over the substrate surface.

In another apsect of the present invention, the first and second electrodes serving as reactive gas exciting means are mesh- or grid-like and the reactive gas from the inlet of the reactive gas supply means and the gas from the reactive region to the exhausting means pass through the mesh- or grid-like electrodes, so that the reactive gas flows in the reaction region uniformly. This permits simultaneous deposition of the reaction product on a plurality of substrates in the reaction region.

In accordance with yet another aspect of the present invention, since the heating means is disposed within the reaction chamber but outside the reaction region, substantially no reaction product is deposited on the heating means, and consequently, the heating effect will not be lessened.

Other objects, features and advantages of the present invention will become more fully apparent from the detailed description taken in conjunction with the accompanying drawings.

DESCRIPTION OF THE PREFERRED EMBODIMENTS

Figure 1:
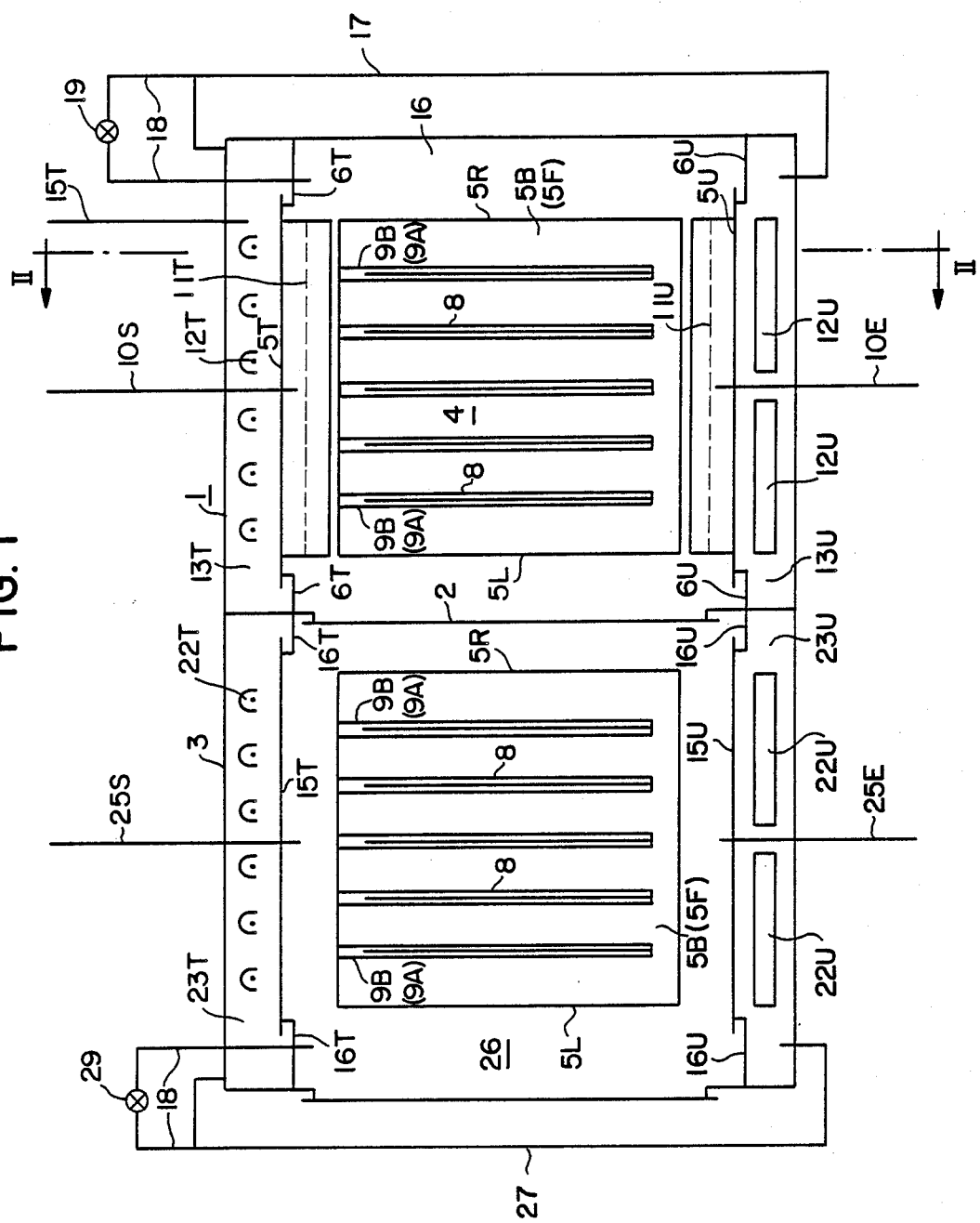
FIG. 1 is a longitudinal-sectional view schematically illustrating a first embodiment of the vapor-phase reaction apparatus of the present invention.
Figure 2:
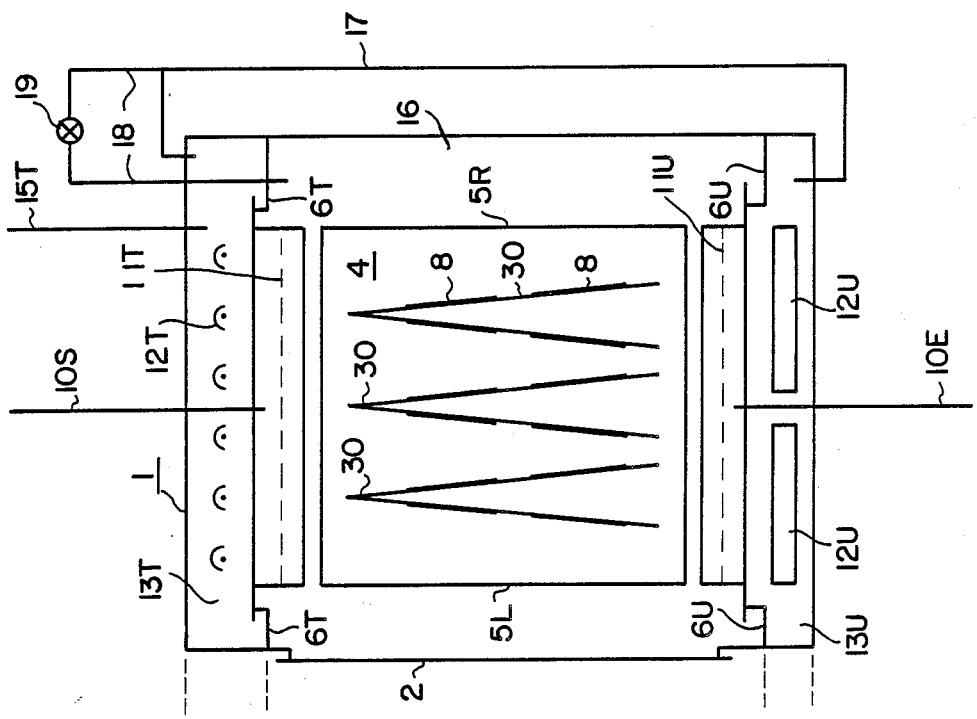
FIG. 2 is a schematic longitudinal-sectional view taken on the line II—II in FIG. 1.

FIGS. 1 and 2 illustrate a first embodiment of the vapor-phase reaction apparatus of the present invention, which has a reaction chamber 1 made of metal, for example.

The reaction chamber 1 includes a right-hand preparatoy room 3 separated by a shutter 2.

The reaction chamber 1 has defined therein a reaction region 4. The reaction region 4 is defined by cup-shaped top and bottom opposing walls 5T and 5U, plate-shaped front and rear opposing walls 5F and 5B and left and right opposing walls 5L and 5R.

The top and bottom opposing walls 5T and 5U are fixedly supported in the reaction chamber 1 through top and bottom ring plates 6T and 6U, respectively. The front and rear opposing walls 5F and 5B and the left and right opposing walls 5L and 5R constitute a "cylinder", that is, an enclosure having a closed cross-sectional shape, and having an open top and an open bottom.

The front, rear, left and right walls 5F, 5B, 5L and 5R are placed into the reaction chamber 1 from the preparatory room 3 after opening the shutter 2. In this case, the front and rear walls 5F and 5B are placed in the reaction chamber 1, together with substrates 8. The substrates 8 are paired off and are held back to back, by vertically extending front and rear sheaths 9F and 9B, on the front and rear walls 5F and 5B in such a manner that they can be taken in and out of the reaction chamber 1 from above. A reactive gas supply pipe 10S, which is connected to a reactive gas source (not shown), extends into the reaction region 4 from the outside of the reaction chamber 1 through the top wall 5T.

An exhaust pipe 10E for leading gas in the reaction region 4 to an exhaust pump (not shown) extends into the reaction region 4 from the outside of the reaction chamber 1 through the bottom wall 5U.

Mesh- or grid-like top and bottom electrodes 11T and 11U are supported, as reactive gas exciting means, substantially horizontally on the top and bottom walls 5T and 5U. A gastight top subchamber 13T is formed between the reaction chamber 1 and the top wall 5T which define the reaction region 4 and a top support ring 6T thereof. A top heater 12T such as an infrared lamp is disposed in the subchamber 13T. A similar bottom heater 12U is disposed in a gastight bottom subchamber 13U defined between the reaction chamber 1 and the bottom wall 5U and a support ring 6U.

The reaction gas supply pipe 10S has an inlet between the top wall 5T and the bottom electrode 11T. The gas exhaust pipe 10E has an outlet between the bottom wall 5U and the bottom electrode 11U. Accordingly, the reactive gas introduced into the reaction region 4 flows therein uniformly. In order to clean the interior of the reaction chamber 1 and the walls 5T and 5U before or after the substrates 8 are placed in the reaction chamber 4, or before the reaction product is deposited on the substrates 8, a cleaning gas pipe 15T extends into the subchamber 13T from the outside, and the subchamber 13T is directly connected via a pipe 17 to the bottom subchamber 13U, and is connected via a pipe 18 and a valve 19 to a chamber 16 which is outside the subchamber 13T and 13U in the reaction chamber 1.

In the preparatory room 3, a heater 22T is disposed in a subchamber 23T defined by a top wall 15T and a support ring 16T, as in the reaction chamber 1. Further, a heater 22U is disposed in a subchamber 23U defined by a bottom wall 15U and a support ring 16U. A cleaning gas supply pipe 25S extends from the outside via the top wall 15T into a chamber 26 outside the subchambers 23T and 23U in the preparatory room 3. A gas exhaust pipe 25E extends from the chamber 26 via the bottom wall 15U to the outside. Further, the subchamber 23T is connected via a cleaning pipe 27 to the chamber 23U and via a valve 29 and a pipe 28 to the chamber 26.

With such an arrangement, the excellent effects described previously can be obtained.

In the above, the substrates 8 are described as being placed in the reaction region 4 so that their major surfaces lie in the vertical direction.

Figure 3:
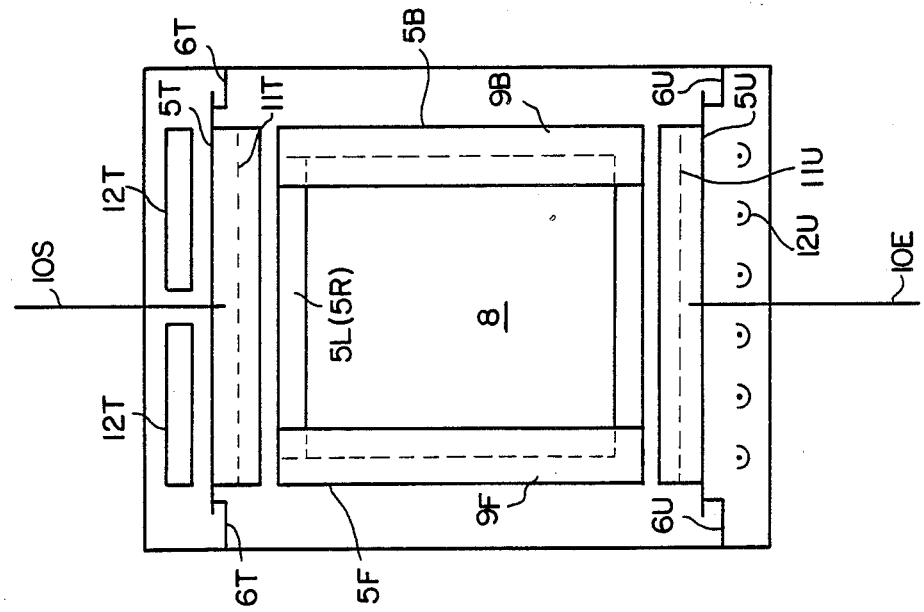
FIG. 3 is a longitudinal-sectional view schematically illustrating a second embodiment of the vapor-phase reaction apparatus of the present invention.

It is also possible, however, that a support plate 30 supporting the substrates 8 is placed in the reaction region 4 so that the major surfaces of the substrates lie in a plane slightly inclined to the vertical plane, as shown in FIG. 3.

Also it is possible to dispose the preparatory room 3 at the stage preceding the reaction chamber 1, to fixedly dispose in the reaction chamber 1 the left and right opposing walls 5L and 5R defining the reaction region 4 and to place the front and rear opposing walls 5F and 5B in the reaction chamber 1, together with the substrates. Further, in this case, the top and bottom electrodes 11T and 11U can also be formed by left and right opposing electrodes mounted on the left and right opposing walls 5L and 5R, respectively. Moreover, the top and bottom heaters 12T and 12U can also be formed by left and right heaters provided on the left and right opposing walls 5L and 5R, respectively.

As the reactive gas exciting means, light of high power energy can also be used together with or in place of the electrodes.

The walls for forming the reaction region 4 may also be made of an insulating material such as quartz or ceramics, conductive material such as aluminum, stainless steel, nickel, titanium, molybdenum or tungsten, or semiconductor material. In the case where the walls are made of such a conductive or semiconductor material and opposing electrodes are used as the exciting means, it is desirable to ground the walls and to apply potentials of the opposite polarities to the electrodes, respectively.

For depositing the reaction product on each substrate homogeneously and to the same thickness, it is preferable that substrates be disposed in the reaction region 4 so that the marginal edges of there effective areas are spaced as far apart from the walls defining the reaction region 4 as possible.

While the foregoing description has been given of the case where a reaction product of a reactive gas is deposited on a substrate, the present invention can also be applied to the case of etching the substrate by an activated reactive gas.

It will be apparent that many modifications and variations may be effected without departing from the scope of the novel concepts of the present invention.

What is claimed is:

1. A vapor-phase reaction apparatus comprising:
   a reaction chamber;
   a pair of electrodes provided in said reaction chamber which, when applied with electric power, produces an electric field therebetween to thus define a reaction space between the electrodes;
   a removable enclosure located between said electrodes containing means for supporting at least one elongated substrate positioned in the direction substantially perpendicular to the direction of the electrodes, said removable enclosure having an open top and an open bottom and said electrodes being located adjacent to and spaced from said open top and said open bottom to approximately close said open top and said open bottom respectively such that the space outside the removable enclosures communicates with the reaction space due to the spacing of the spacing of a pair of electrodes from the open top and bottom of the removable enclosure;
   gas feeding means for inputting a reaction gas into said reaction chamber; and
   exhausting means for said reaction chamber.

2. The apparatus of claim 1 wherein the configuration and size of the perimeter of said electrodes are approximately the same as that of the cross section of said enclosure.

3. The apparatus of claim 1 wherein said supporting means supports a plurality of substrates in parallel relationship.

4. A vapor-phase reaction apparatus comprising:
   a reaction chamber;
   a removable enclosure and having an open top and an open bottom, said enclosure having at least one wall and containing means for supporting at least one elongated substrate positioned in a direction substantially perpendicular to the direction of the wall;
   a pair of electrodes located adjacent to and spaced from said open top and said open bottom to approximately close said open top and said open bottom such that the space outside the removable enclosures communicates with the reaction space due to the spacing of the pair of electrodes from the open top and bottom of the removable enclosure;

gas feeding means for inputting a reaction gas into said reaction chamber; and exhausting means for said reaction chamber:

5. The apparatus of claim 4 further comprising a top cup and a bottom cup respectively disposed adjacent to and spaced from said open top and said open bottom of the removable enclosure and which associate with said enclosure in order to confine said reaction space within the top and bottom cups.

6. The apparatus as in claim 5 where said pair of electrodes are respectively disposed within the top and bottom cups.

7. The apparatus as in claim 6 where the gas feeding means feeds the reaction gas into the top cup.

8. The apparatus of claim 4 where each of said electrodes is mesh- or grid-like.

9. The apparatus as in claim 4 where said removable enclosure is a cylinder.

* * * * *